(12) United States Patent
Knyazik et al.

(10) Patent No.: US 9,536,710 B2
(45) Date of Patent: Jan. 3, 2017

(54) TUNABLE GAS DELIVERY ASSEMBLY WITH INTERNAL DIFFUSER AND ANGULAR INJECTION

(71) Applicant: Applied Materials, Inc., Santa Clara, CA (US)

(72) Inventors: Vladimir Knyazik, Palo Alto, CA (US); Kyle Tantiwong, Livermore, CA (US); Samer Banna, San Jose, CA (US); Waheb Bishara, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 503 days.

(21) Appl. No.: 13/959,801

(22) Filed: Aug. 6, 2013

(65) Prior Publication Data

US 2014/0237840 A1 Aug. 28, 2014

Related U.S. Application Data

(60) Provisional application No. 61/768,901, filed on Feb. 25, 2013.

(51) Int. Cl.
*F26B 21/00* (2006.01)
*H01J 37/32* (2006.01)

(52) U.S. Cl.
CPC ....... *H01J 37/32449* (2013.01); *F26B 21/004* (2013.01); *H01J 37/3244* (2013.01)

(58) Field of Classification Search
CPC .. C23C 16/00; C23C 16/455; C23C 16/45563; C23C 16/4558; H01H 37/3244; H01H 37/32449; F26B 21/004; H01J 37/3244; H01J 37/32449

See application file for complete search history.

(56) References Cited

U.S. PATENT DOCUMENTS 7,785,417 B2 8/2010 Ni et al.
8,025,731 B2 9/2011 Ni et al.
(Continued)

FOREIGN PATENT DOCUMENTS

KR 2003-0095801 A 12/2003
KR 2010-0131566 A 12/2010

OTHER PUBLICATIONS

PCT Notification of Transmittal of the International Search Report and the Written Opinion of the International Searching Authority for International Application No. PCT/US2014/014455 dated May 28, 2014; 11 total pages.

(Continued)

*Primary Examiner* — Jiping Lu
(74) *Attorney, Agent, or Firm* — Patterson & Sheridan, LLP (57) ABSTRACT

An apparatus for providing processing gases to a process chamber with improved uniformity is disclosed. One embodiment provides a gas delivery assembly. The gas delivery assembly includes a hub, a nozzle, and one or more gas diffusers disposed in the nozzle. The nozzle has a cylindrical body with a side wall and a top surface. A plurality of injection passages are formed inside the nozzle to deliver processing gases into the process chamber via a plurality of outlets disposed in the side wall. The injection passages are configured to direct process gases out of each outlet disposed in the side wall in a direction which is not radially aligned with a centerline of the hub.

8 Claims, 5 Drawing Sheets

(56) References Cited

U.S. PATENT DOCUMENTS

| | | | |
|---|---|---|---|
| 2009/0159424 A1* | 6/2009 | Liu | H01J 37/32449 204/164 |
| 2009/0272492 A1 | 11/2009 | Katz et al. | |
| 2010/0068891 A1 | 3/2010 | Hatanaka et al. | |
| 2012/0100292 A1 | 4/2012 | Park | |
| 2014/0237840 A1 | 8/2014 | Knyazik et al. | |
| 2015/0371826 A1 | 12/2015 | Rozenzon et al. | |

OTHER PUBLICATIONS

US Provisional U.S. Appl. No. 60/887,774, filed Feb. 1, 2007.

* cited by examiner

TUNABLE GAS DELIVERY ASSEMBLY WITH INTERNAL DIFFUSER AND ANGULAR INJECTION

CROSS-REFERENCE TO RELATED APPLICATIONS

This application claims benefit of U.S. Provisional Patent Application Ser. No. 61/768,901, filed Feb. 25, 2013, which is herein incorporated by reference.

This application is related to U.S. patent application Ser. No. 13/790,735 filed Mar. 8, 2013.

BACKGROUND

Field

Embodiments of the present invention generally relate to a substrate processing system. More particularly, embodiments of the present invention relate to an apparatus for providing processing gases to a process chamber with improved uniformity.

Description of the Related Art

During manufacturing of microelectronic devices, inductively coupled plasma reactors are used in various processes. Conventional inductively coupled plasma reactors generally include a vacuum chamber having a side wall and a ceiling, a workpiece support pedestal within the chamber and generally facing the ceiling, a gas inlet capable of supplying one or more processing gases into the chamber, and one or more coil antennas overlying the ceiling. A gas inlet generally includes one or more gas lines coupled to a gas delivery assembly with a plurality of outlets.

The gas delivery assembly generally includes a hub, a nozzle, and outlets disposed in the side wall of the nozzle. Typically there is a vacuum pump disposed in the vacuum chamber to maintain the vacuum environment inside the chamber. It has been observed that in certain applications or chamber designs, there is a skew in the distribution of processing gas.

Therefore, there is a need for an improved apparatus for delivering processing gas with improved uniformity.

SUMMARY

Embodiments of the present invention relate to an apparatus for providing processing gases to a process chamber with improved uniformity. One embodiment of the present invention provides a gas delivery assembly. The gas delivery assembly includes a nozzle and one or more gas diffusers disposed in the nozzle. The nozzle has a cylindrical body with a side wall and a top surface. A plurality of injection passages are formed inside the nozzle to deliver processing gases into the process chamber via a plurality of outlets disposed in the side wall. The injection passages are configured to direct process gases out of each outlet disposed in the side wall in a direction which is not radially aligned with a centerline of the hub.

In one embodiment, a gas delivery assembly is disclosed. The gas delivery assembly includes a nozzle having a cylindrical body with a side wall and a top surface, a first trench disposed in the top surface, and a first diffuser disposed in the first trench. A first plenum is formed between the first diffuser and a bottom of the first trench. The gas delivery assembly further includes a plurality of outer injection passages formed within the nozzle. Each of the outer injection passages extends from the bottom of the first trench to a first location inside the nozzle that is a first distance away from the top surface. The gas delivery assembly further includes a connecting passage connecting each of the outer injection passages to a first outlet disposed in the side wall of the nozzle. The connecting passage is substantially parallel to a bottom of the nozzle and is not radially aligned with a centerline of the nozzle.

In another embodiment, a substrate processing system is disclosed. The substrate processing system includes a chamber body defining a processing volume and a chamber lid having a central opening. The substrate processing system further includes a substrate support disposed in the processing volume and a gas delivery assembly having a hub and a nozzle disposed over the chamber lid. A portion of the nozzle is positioned in the processing volume through the central opening in the chamber lid. The nozzle includes a cylindrical body having a side wall, a top surface having one or more trenches, and a gas diffuser disposed inside each trench.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to an apparatus for providing processing gases to a process chamber with improved uniformity. More particularly, embodiments of the present invention provide a gas delivery assembly including a hub for receiving one or more gases from a source, a nozzle for injecting the one or more gases to a process chamber through a plurality of injection passages and one or more gas diffusers disposed in a top surface of the nozzle. The gas diffusers create a small pressure head when the nozzle is coupled to the hub, thus the processing gases received from a single source can have uniform flow through multiple injection points.

Figure 1:
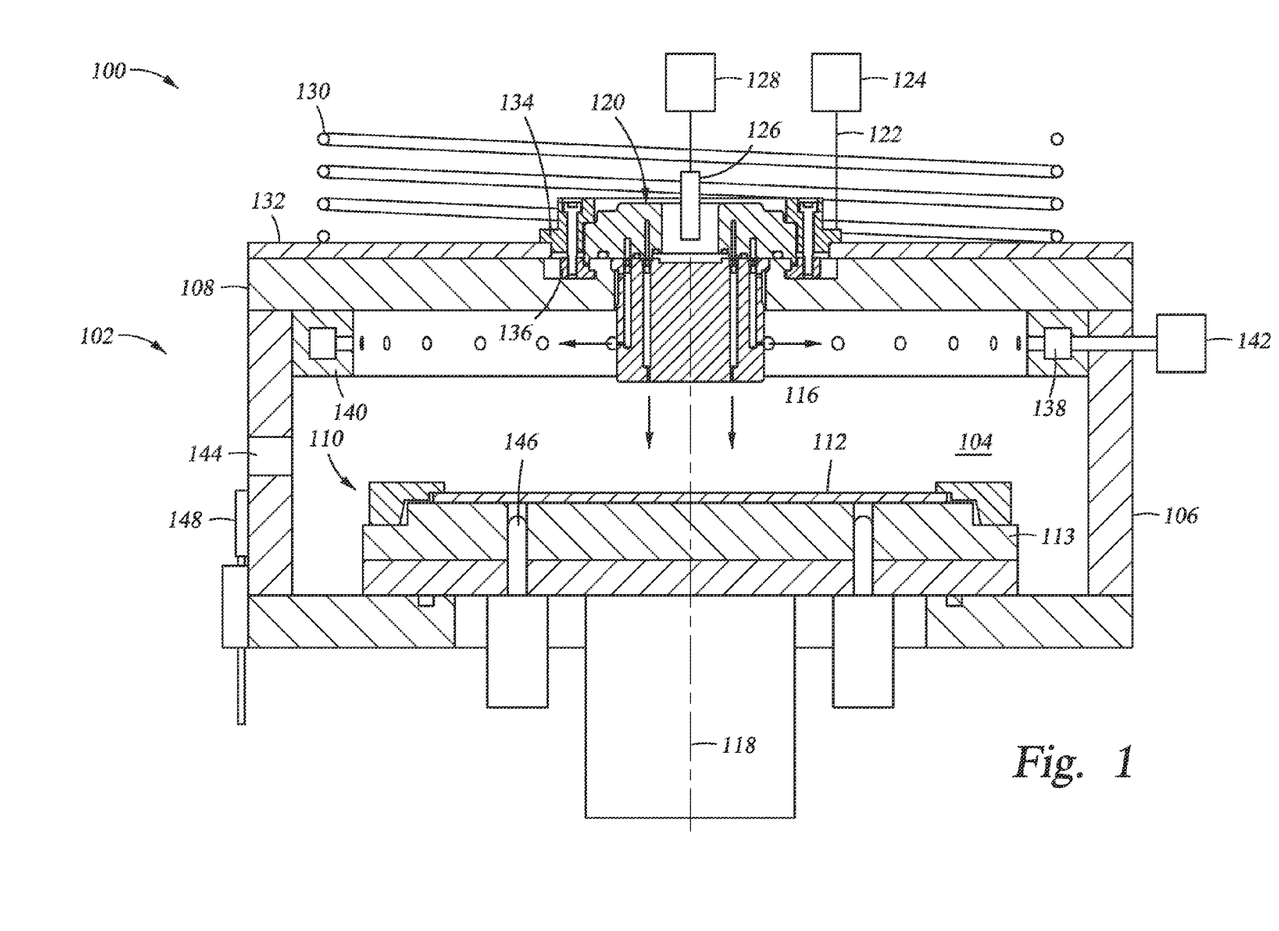
FIG. 1 schematically illustrates a sectional view of a plasma processing system according to one embodiment of the invention.

FIG. 1 schematically illustrates a sectional view of a substrate processing system 100, for processing a variety of substrates and accommodating a variety of substrate sizes, for example, a substrate diameter of up to about 300 mm or 450 mm. The substrate processing system 100 includes a chamber body 102 having a processing volume 104 defined therein. The chamber housing assembly 102 may include sidewalls 106 and a chamber lid 108. A substrate support assembly 110 may be disposed in the processing volume 104. The substrate support assembly 110 supports a substrate 112 during processing. A slit valve opening 144 may be formed in the chamber wall 106 to allow a robot (not shown) to move substrates in and out of the processing volume 104. A slit valve door 148 may be used to selectively close the slit valve opening 144. A plurality of lift pins 146 may be selectively extended from the substrate support assembly 110 to facilitate substrate transfer between the robot and the substrate support assembly 110. In one embodiment, the substrate support assembly 110 may include an electrostatic chuck 113 for securing the substrate 112 thereon during processing.

The chamber lid 108 has an opening 116 to allow entrance of one or more processing gases. The opening 116 may be a central opening located near a centerline 118 of the substrate processing system 100 and correspond to a center of the substrate 112 being processed.

A gas delivery assembly 120 is disposed over the chamber lid 108 through the opening 116. The gas delivery assembly 120 may be connected to a gas source 124 through one or more gas input lines 122 to supply one or more processing gases to the processing volume 104. In one embodiment, the one or more processing gases may exit the processing volume 104 via a pumping channel 138 formed in a liner 140 disposed inside the processing volume 104. The pumping channel 138 may be in fluid communication with a vacuum pump 142. Alternatively, the vacuum pump 142 may be connected to the processing volume 104 directly.

A sensor 126 may be disposed over the chamber lid 108 and configured to monitor the substrate 112 in the processing volume 104 through the gas delivery assembly 120. The sensor 126 may be connected to a system controller 128 to provide feedback for process control.

The system controller 128 comprises a central processing unit (CPU) (not shown), a memory (not shown), and support circuits (not shown) for the CPU and facilitates control of the components of the process chamber 100. The system controller 128 may be one of any form of general-purpose computer processor that can be used in an industrial setting for controlling various chambers and sub-processors. The memory of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The inventive method is generally stored in the memory or other computer-readable medium accessible to the CPU as a software routine. Alternatively, such software routine may also be stored and/or executed by a second CPU (not shown) that is remotely located from the hardware being controlled by the CPU.

Optionally, the substrate processing system 100 may include an antenna assembly 130 disposed over the chamber lid 108. The antenna assembly 130 is configured to generate plasma in the processing volume 104. The antenna assembly 130 may include one or more solenoidal interleaved coil antennas disposed coaxial with the centerline 118 of the substrate processing system 100. A heater assembly 132 may be disposed over the chamber lid 108. The heater assembly 132 may be secured to the chamber lid 108 by clamping members 134, 136.

Figure 2:
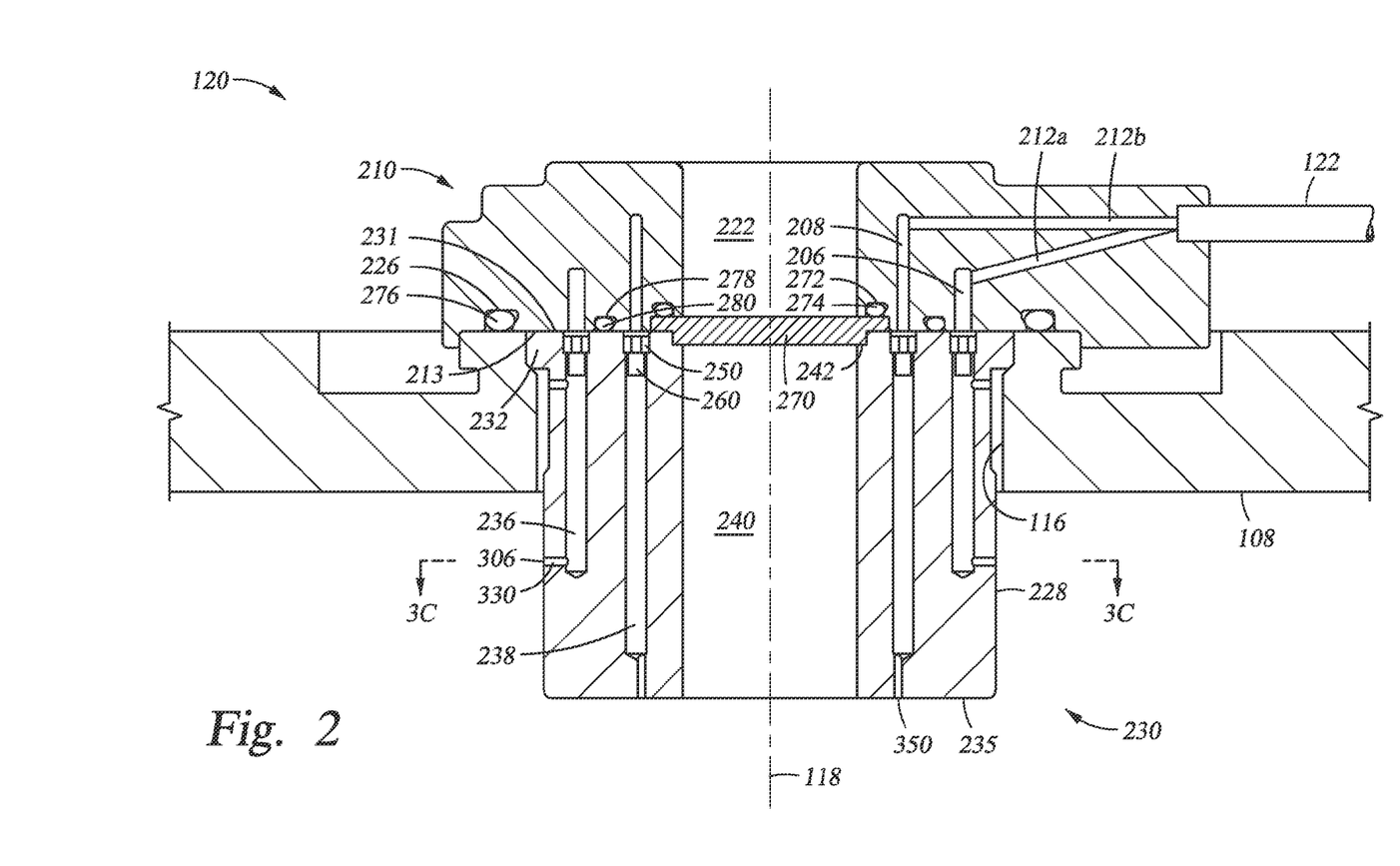
FIG. 2 is an enlarged sectional view of a gas delivery assembly according to one embodiment of the invention.

The gas delivery assembly 120 is configured to supply one or more processing gases to the processing volume 104 in a uniform manner. FIG. 2 is an enlarged sectional view of the gas delivery assembly 120 disposed on the chamber lid 108 with the clamping members 134, 136 and the heater assembly 132 removed. In the embodiment of FIG. 2, the centerline 118 of the processing system 100 is also the centerline of the gas delivery assembly 120.

As shown in FIG. 2, the gas delivery assembly 120 includes a hub 210, a nozzle 230 and one or more gas diffusers 250 disposed in the nozzle 230. When assembled, the nozzle 230 is disposed through the opening 116 of the chamber lid 108. The nozzle 230 may have a flange 232 for mounting the nozzle 230 on the chamber lid 108. A portion of the nozzle 230 protrudes into the processing volume 104 through the opening 116 to deliver processing gas to the processing volume 104. The hub 210 is positioned on the chamber lid 108 covering the opening 116 and the nozzle 230. The hub 210 is disposed over the nozzle 230 and provides an interface between the gas input lines 122 and the nozzle 230.

The hub 210 has a body 211 shaped to enclose the opening 116 and interface with the nozzle 230. The body 211 has an outer surface 214 facing the exterior environment and a bottom surface 213 for contacting with the nozzle 230 and the chamber lid 108. In one embodiment, the body 211 is substantially circular and concentric with the centerline 118. The body 211 has an outer channel 206 and an inner channel 208. In one embodiment, both inner and outer channels 208, 206 are circular and the outer channel 206 is arranged radially outward of the inner channel 208. In one embodiment, the outer channel 206 and the inner channel 208 have different heights in the body 211. One or more inlet passages 212a, 212b are formed through the body 211 and connected to the outer channel 206 and the inner channel 208. Because the outer and inner channels 206, 208 have different heights, the inlet passage 212b connected to the inner circular channel 208 does not disrupt, e.g., is isolated from, the outer channel 206. The one or more inlet passages 212a, 212b are adapted to connect with the one or more gas input lines 122. In one embodiment, the one or more inlet passages 212a, 212b are non-symmetrical relative to the centerline 118.

The top surface 231 of the nozzle 230 has one or more trenches 260 and the gas diffusers 250 are disposed inside at least one of the trenches 260 (detail described below). A gland 226 may be formed in the bottom surface 213 of the hub 210 to receive a seal 276. When assembled, the glands 226 and the seals 276 surround the opening 116 of the chamber lid 108 and the seal 276 contacts the chamber lid 108 to form an air tight seal between the processing volume 104 and the exterior environment. Another gland 278 may be formed between the inner channel 208 and the outer channel 206 to receive a seal 280 to form an air tight seal between the two channels.

In one embodiment, the gas injection assembly 120 includes an observation window 270. The body 211 of the hub 210 may have a through hole 222 and the nozzle 230 may be a hollow cylinder having a central opening 240. The observation window 270 may be disposed between the hub 210 and the nozzle 230. In one embodiment, the nozzle 230 may have a recess 242 for supporting the observation window 270. The hub 210 may have a gland 228 formed to receive a seal 274 to provide a vacuum seal between the hub 210 and the observation window 270. In one embodiment, the observation window 270 is fabricated from quartz.

The nozzle 230 has a cylindrical body with a side wall 228 and a top surface 231 for contacting with the bottom surface 213 of the hub 210. The nozzle 230 has a plurality of inner injection passages 238 and a plurality of outer injection passages 236 for injecting one or more processing gases from the outer and inner channels 206, 208 of the hub 210 to the processing volume 104. In one embodiment, the outer injection passages 236 are arranged radially outward of the inner injection passages 238. The outer and inner injection passages 236, 238 may have outlets at various positions to achieve gas injection. In one embodiment, as shown in FIG. 2, the outer injection passages 236 have outlets 306 disposed in the side wall 228 and are connected to the outlets 306 by connecting passages 330. The inner injection passages 238 have outlets 350 disposed in a bottom surface 235 of the nozzle 230 and directed downward from the nozzle 230. In one embodiment, the outer and inner injection passages 236, 238 are evenly distributed in azimuthal orientation (e.g., in an evenly distributed polar array).

Figure 3A:
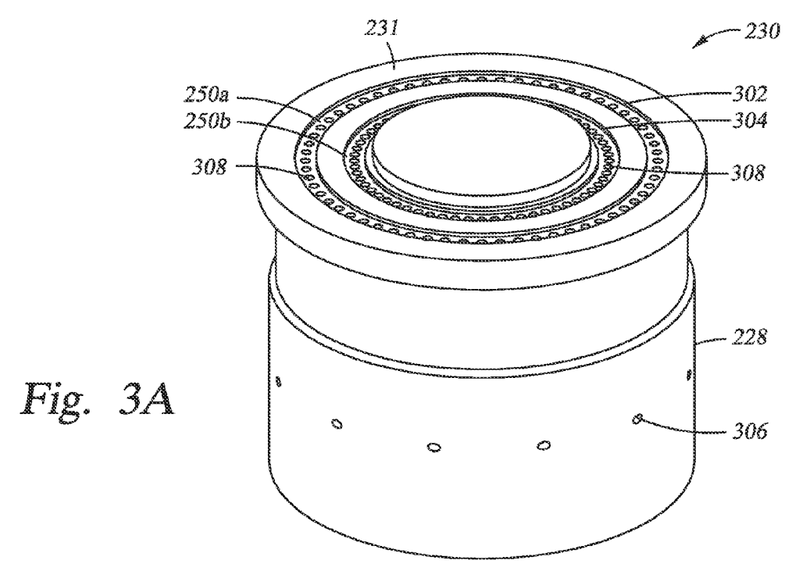
FIG. 3A is an isometric view of a nozzle according to one embodiment of the invention.
Figure 3B:
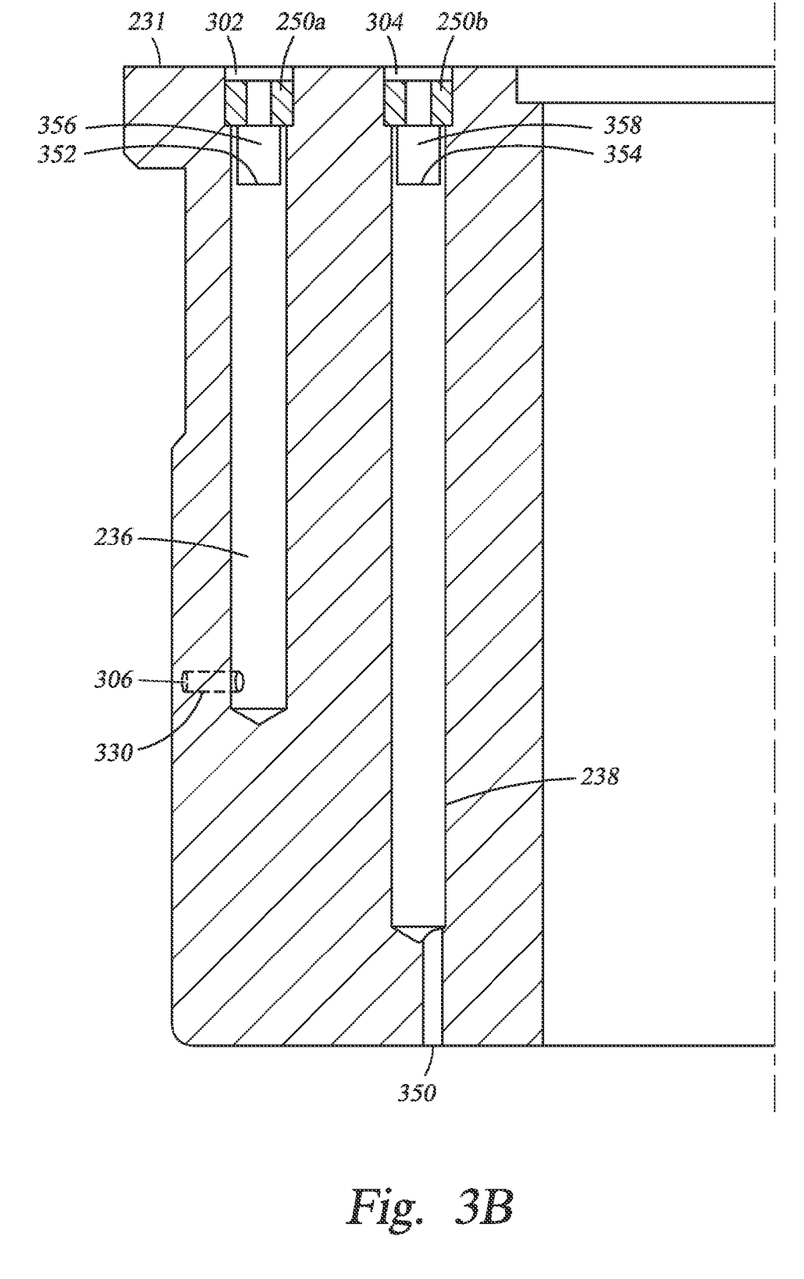
FIG. 3B is a partial sectional view of the nozzle of FIG. 3A.

FIGS. 3A-3D illustrate the nozzle 230 according to various embodiments of the invention. FIG. 3A is an isometric view of the nozzle 230, while FIG. 3B is a partial sectional view of the nozzle 230. The top surface 231 of the nozzle 230 has an outer trench 302 and an inner trench 304. In one embodiment, the outer and inner trenches 302, 304 are circular and concentric with the centerline 118. The plurality of outlets 306 of the outer injection passages 236 are disposed in the side wall 228. In one embodiment, the outlets 306 are disposed evenly along the circumference of the side wall 228.

As shown in FIG. 3B, the gas diffusers 250a, 250b are disposed inside the outer and inner trenches 302, 304, respectively. The gas diffusers 250a, 250b are spaced from bottoms 352, 354 of the outer and inner trenches 302, 304, thus, creating plenums 356, 358 between the gas diffusers 250a, 250b and bottoms 352, 354 of the outer and inner trenches 302, 304 so that the processing gases may be evenly distributed into the injection passages 236, 238. The gas diffusers 250a, 250b may be any suitable gas permeable material or structure. In one embodiment, as shown in FIG. 3A, the gas diffusers 250a, 250b have a plurality of holes 308. The gas diffusers 250a, 250b may be made of alumina or the same material as the nozzle 230. In one embodiment, the nozzle 230 and the gas diffusers 250a, 250b are made of ceramic material. When the hub 210 and the nozzle 230 are assembled, the inner trench 304 of the nozzle 230 is aligned with the inner channel 208 of the hub 210, and the outer trench 302 of the nozzle 230 is aligned with the outer channel 206 of the hub 210.

As shown in FIG. 3B, the outer injection passage 236 extends from the bottom 352 of the outer trench 302 to a location within the nozzle 230 that is a distance away from the top surface 231. The inner injection passage 238 extends from the bottom 354 of the inner trench 304 to a location within the nozzle 230 that is a distance away from the top surface 231. In one embodiment, the inner injection passage 238 extends further into the nozzle 230 than the outer injection passage 236.

Figure 3C:
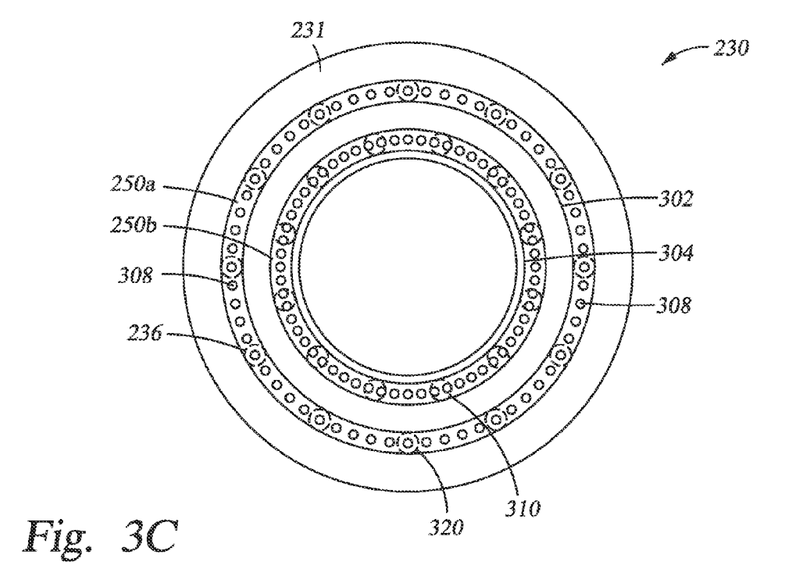
FIG. 3C is a top view of the nozzle of FIG. 3A.

FIG. 3C is a top view of the nozzle 230, in which the gas diffusers 250a, 250b are transparent for better illustration. As described above, the nozzle 230 has the plurality of outer injection passages 236 and the plurality of inner injection passages 238 disposed therein. In one embodiment, the outer injection passages 236 are arranged radially outward of the inner injection passages 238. As shown in FIG. 3C, the outer injection passages 236 have inlets 320 disposed at the bottom of the outer trench 302, and the inner injection passages 236 have inlets 310 disposed at the bottom of the inner trench 304. The inlets 310, 320 may be disposed evenly inside the inner and outer trenches 304, 302. The area of one of the plurality of holes 308 of the gas diffusers 250a, 250b may be smaller than the surface area of one of the inlets 310, 320. In one embodiment, the total area of the holes 308 of the diffuser 250a equals the total surface area of the inlets 320, and the total area of the holes 308 of the diffuser 250b equals the total surface area of the inlets 310. The gas diffusers 250a, 250b create a small pressure head when the nozzle 230 is coupled to the hub 210, thus the processing gases received from a single gas source 124 can have uniform flow through multiple injection points.

Figure 3D:
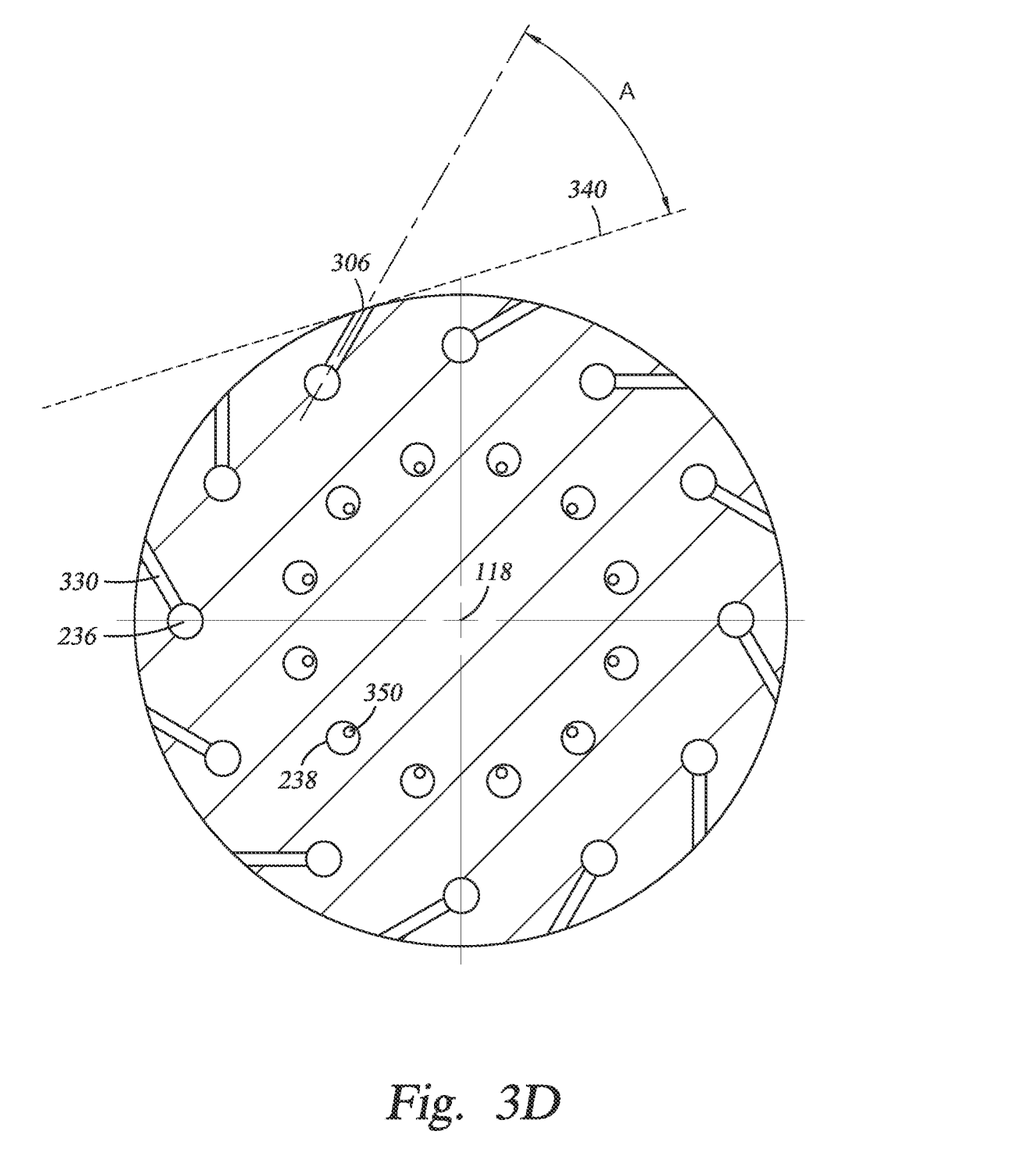
FIG. 3D is a sectional view of the nozzle of FIG. 3A taken through section line 3C depicted in FIG. 2.

FIG. 3D is a sectional view of the nozzle 230 without the gas diffusers 250. As shown in FIG. 2, the outer injection passages 236 extends from the bottom of the outer trench 302 to a distance inside the nozzle 230 from the top surface 231, and the outlets 306 of the outer injection passages 236 are disposed in the side wall 228. As shown in FIG. 3D, each outlet 306 and the corresponding outer injection passage 236 are connected by a connecting passage 330. The connecting passage 330 is not perpendicular to a tangent 340 of the side wall 228 at the outlet 306 (e.g., the angle "A" in FIG. 3D does not equal to 90 degrees). In other words, the connecting passages 330 are not radially aligned with the centerline 118 of the chamber body 102, which is also the centerline of the hub 210, nozzle 230, and gas diffusers 250a, 250b. In one embodiment, the angle "A" ranges from about 15 degrees to about 60 degrees. The processing gases exiting the outlet 306 are directed in the same direction defined by the connecting passage 330. If the angle "A" is 90 degrees, then the processing gases coming out of the outlet that is facing the vacuum pump 142 may travel at a faster speed compare to the processing gases coming out of all other outlets. By changing the angle "A" to an angle other than 90 degrees, the processing gases are coming out of each outlet at substantially the same speed, thus creating a more uniform gas flow inside the process chamber.

In summary, by adding one or more internal gas diffusers in the nozzle of a gas delivery assembly along with changing the angle of processing gases coming out of outlets disposed along the circumference of the side wall of the nozzle, a more uniform flow of the processing gases is achieved.

While the foregoing is directed to embodiments of the present invention, other and further embodiments of the invention may be devised without departing from the basic scope thereof, and the scope thereof is determined by the claims that follow.

What is claimed is:
1. A substrate processing system, comprising:
   a chamber body defining a processing volume, wherein the chamber body comprises a chamber lid having a central opening;
   a substrate support disposed in the processing volume; and
   a gas delivery assembly having a hub and a nozzle disposed over the chamber lid, and a portion of the nozzle is positioned in the processing volume through the central opening in the chamber lid, wherein the nozzle comprises:
      a cylindrical body having a side wall;
      a top surface having one or more trenches, wherein each trench includes a bottom; and a gas diffuser disposed inside each trench, wherein a plenum is formed between the gas diffuser and the bottom of each trench.

2. The substrate processing system of claim 1, further comprising a plurality of outlets formed in the side wall of the nozzle.

3. The substrate processing system of claim 2, further comprising a plurality of inner injection passages and a plurality of outer injection passages formed inside the nozzle.

4. The substrate processing system of claim 1, wherein one or more trenches are circular.

5. The substrate processing system of claim 4, wherein each diffuser comprises a plurality of holes.

6. A substrate processing system, comprising:
a chamber body defining a processing volume, wherein the chamber body comprises a chamber lid having a central opening;
a substrate support disposed in the processing volume; and
a gas delivery assembly having a hub and a nozzle disposed over the chamber lid, and a portion of the nozzle is positioned in the processing volume through the central opening in the chamber lid, wherein the nozzle comprises:
a cylindrical body having a side wall;
a plurality of outlets formed in the side wall;
a plurality of inner injection passages and a plurality of outer injection passages formed inside the nozzle;
a top surface having one or more trenches; and
a gas diffuser disposed inside each trench, wherein the top surface has an inner trench and an outer trench, and each of the outer injection passages extends from an outer inlet disposed at a bottom of the outer trench to a location inside the nozzle that is a distance away from the top surface and each of the inner injection passages extends from an inner inlet disposed at a bottom of the inner trench to a bottom surface of the nozzle.

7. The substrate processing system of claim 6, wherein each outlet is connected to one of the plurality of the outer injection passages by a connecting passage, wherein the connecting passage is substantially parallel to the bottom surface of the nozzle and is not radially aligned with a centerline of the hub.

8. The substrate processing system of claim 7, wherein the angle between the connecting passage and the tangent of the cylindrical side wall at the outlet ranges from about 15 degrees to about 60 degrees.

\* \* \* \* \*